(12) United States Patent
Heidborn et al.

(10) Patent No.: US 8,003,974 B2
(45) Date of Patent: Aug. 23, 2011

(54) LED SEMICONDUCTOR ELEMENT HAVING INCREASED LUMINANCE

(75) Inventors: Peter Heidborn, Zeitlarn (DE); Reiner Windisch, Pettendorf (DE); Ralph Wirth, Mintraching-Auhof (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/441,758

(22) PCT Filed: Aug. 28, 2007

(86) PCT No.: PCT/DE2007/001535
§ 371 (c)(1),
(2), (4) Date: Aug. 14, 2009

(87) PCT Pub. No.: WO2008/043324
PCT Pub. Date: Apr. 17, 2008

(65) Prior Publication Data
US 2009/0309120 A1    Dec. 17, 2009

(30) Foreign Application Priority Data

Sep. 28, 2006  (DE) .................. 10 2006 046 039
Nov. 2, 2006   (DE) .................. 10 2006 051 745

(51) Int. Cl.
| | |
|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 27/15 | (2006.01) |
| H01L 29/26 | (2006.01) |
| H01L 31/12 | (2006.01) |
| H01L 33/00 | (2006.01) |
| H01L 29/18 | (2006.01) |
| H01L 29/22 | (2006.01) |

(52) U.S. Cl. ............. 257/13; 257/79; 257/88; 257/99; 257/E33.001; 257/E33.012

(58) Field of Classification Search .............. 257/13, 257/79, 88, 99, E33.001, E33.012
See application file for complete search history.

(56) References Cited

U.S. PATENT DOCUMENTS 4,318,059 A * 3/1982 Lang et al. ............. 372/46.011
(Continued)

FOREIGN PATENT DOCUMENTS

CA   2 360 502   11/2000
(Continued)

OTHER PUBLICATIONS

I. Schnitzer et al., "30% external quantum efficiency from surface textured, thin-film light-emitting diodes", Appl. Phys. Lett. vol. 63, No. 16, pp. 2174-2176, Oct. 1993.

*Primary Examiner* — Ida M Soward
(74) *Attorney, Agent, or Firm* — Cohen Pontani Lieberman & Pavane LLP

(57) ABSTRACT

An LED semiconductor element having at least one first radiation-generating active layer and at least one second radiation-generating active layer which is stacked above the first active layer in a vertical direction and is connected in series with the first active layer. The first active layer and the second active layer are electrically conductively connected by a contact zone.

12 Claims, 2 Drawing Sheets

U.S. PATENT DOCUMENTS

| | | | | |
|---|---|---|---|---|
| 5,559,819 A | * | 9/1996 | Abe et al. | 372/46.01 |
| 5,684,309 A | | 11/1997 | McIntosh et al. | |
| 5,699,375 A | * | 12/1997 | Paoli | 372/50.11 |
| 5,831,277 A | | 11/1998 | Razeghi | |
| 5,999,553 A | * | 12/1999 | Sun | 372/50.12 |
| 6,153,894 A | * | 11/2000 | Udagawa | 257/96 |
| 6,661,824 B2 | * | 12/2003 | Onishi | 372/50.1 |
| 6,804,279 B2 | * | 10/2004 | Furukawa | 372/43.01 |
| 6,897,489 B1 | * | 5/2005 | Peng et al. | 257/96 |
| 6,934,309 B2 | * | 8/2005 | Nishikawa et al. | 372/36 |
| 6,956,322 B2 | * | 10/2005 | Ikeda | 313/498 |
| 7,049,746 B2 | * | 5/2006 | Mano et al. | 313/512 |
| 7,091,055 B2 | * | 8/2006 | Hahm et al. | 438/22 |
| 7,112,827 B2 | * | 9/2006 | Hayakawa et al. | 257/116 |
| 7,211,822 B2 | | 5/2007 | Nagahama et al. | |
| RE40,230 E | * | 4/2008 | Kneissi et al. | 372/50.1 |
| 7,474,681 B2 | * | 1/2009 | Lin et al. | 372/43.01 |
| 7,672,349 B2 | * | 3/2010 | Sato et al. | 372/50.1 |
| 7,714,504 B2 | * | 5/2010 | Forrest et al. | 313/504 |
| 2003/0091085 A1 | * | 5/2003 | Northrup et al. | 372/50 |
| 2004/0066816 A1 | * | 4/2004 | Collins et al. | 372/44 |
| 2004/0096996 A1 | * | 5/2004 | Cheng et al. | 438/22 |
| 2004/0129944 A1 | | 7/2004 | Chen | |
| 2004/0136425 A1 | * | 7/2004 | Song | 372/45 |
| 2005/0067627 A1 | | 3/2005 | Shen et al. | |
| 2005/0140278 A1 | * | 6/2005 | Kato | 313/504 |
| 2005/0189551 A1 | | 9/2005 | Peng et al. | |
| 2005/0194587 A1 | | 9/2005 | Hsieh et al. | |
| 2005/0208688 A1 | * | 9/2005 | Otoma et al. | 438/22 |
| 2005/0238310 A1 | * | 10/2005 | Hoshi et al. | 385/129 |
| 2005/0266588 A1 | | 12/2005 | Stauss | |
| 2006/0006375 A1 | * | 1/2006 | Ou et al. | 257/14 |
| 2006/0062022 A1 | | 3/2006 | Foong et al. | |
| 2006/0097269 A1 | | 5/2006 | Lester | |
| 2006/0108588 A1 | * | 5/2006 | Osame et al. | 257/72 |
| 2006/0166391 A1 | * | 7/2006 | Nemoto | 438/35 |
| 2007/0069220 A1 | | 3/2007 | Ogihara | |
| 2007/0069223 A1 | * | 3/2007 | Chen et al. | 257/88 |
| 2007/0071054 A1 | * | 3/2007 | Takahashi | 372/50.1 |
| 2007/0080355 A1 | * | 4/2007 | Lin et al. | 257/81 |
| 2009/0173961 A1 | | 7/2009 | Windisch et al. | |
| 2009/0230415 A1 | * | 9/2009 | Ide et al. | 257/98 |
| 2010/0265979 A1 | * | 10/2010 | Weisbuch et al. | 372/45.01 |

FOREIGN PATENT DOCUMENTS

| | | |
|---|---|---|
| DE | 39 29 477 | 3/1991 |
| DE | 44 38 598 | 5/1996 |
| DE | 101 40 831 | 3/2003 |
| DE | 10 2004 004 765 | 9/2005 |
| DE | 10 2005 006 821 | 9/2005 |
| DE | 20 2005 011 804 | 11/2005 |
| DE | 10 2004 026 1 | 12/2005 |
| DE | 10 2006 039 3 | 7/2007 |
| EP | 1 017 113 | 1/1998 |
| EP | 1 403 935 | 9/2003 |
| GB | 1 485 462 | 9/1977 |
| GB | 2 428 879 | 2/2007 |
| JP | 08046280 A * | 2/1996 |
| JP | 9-129923 | 5/1997 |
| JP | 2000-244020 | 9/2000 |
| WO | WO 98/31055 | 7/1998 |
| WO | WO 01/39282 | 5/2001 |

* cited by examiner

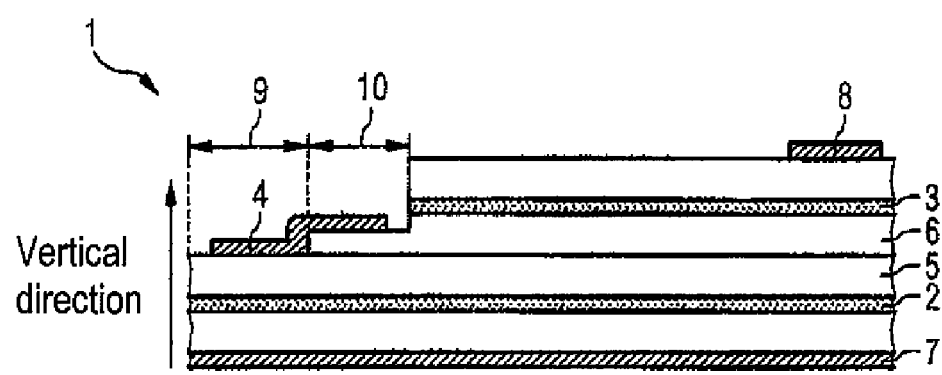
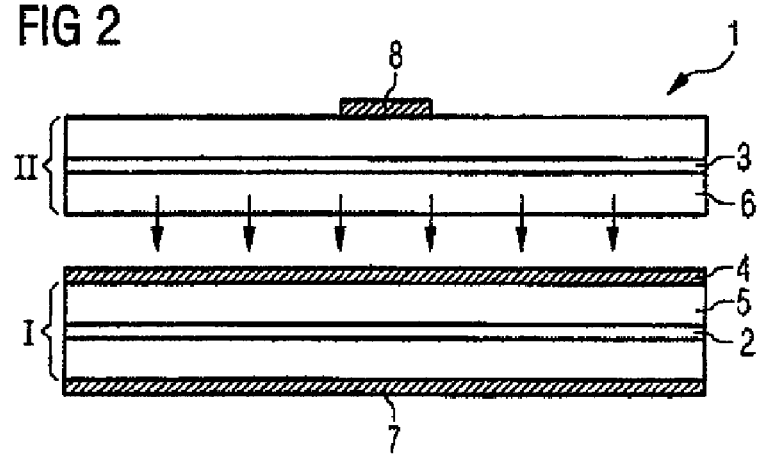

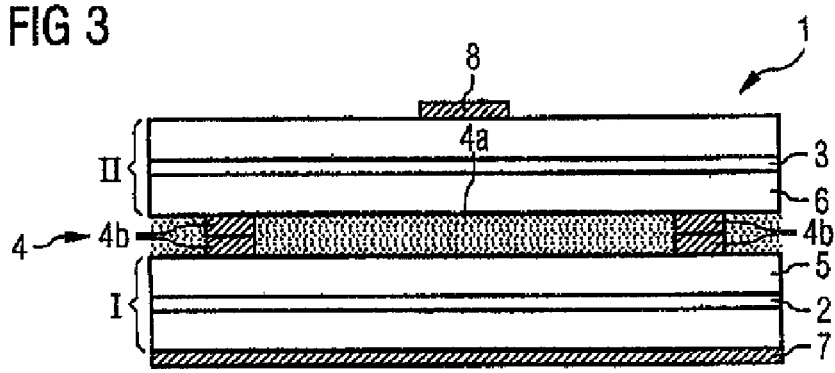
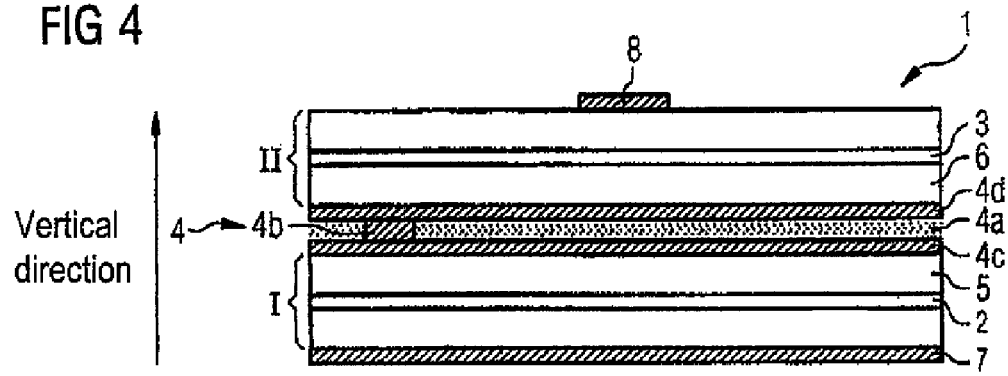

LED SEMICONDUCTOR ELEMENT HAVING INCREASED LUMINANCE

RELATED APPLICATIONS

This is a U.S. national stage under 35 USC §371 of application No. PCT/DE2007/001535, filed on Aug. 28, 2007.

This application claims the priority of German Patent Application Nos. 10 2006 046 039.1 filed Sep. 28, 2006 and 10 2006 051 745.8 filed Nov. 2, 2006, the entire content of both of which is hereby incorporated by reference.

FIELD OF THE INVENTION

The invention relates to an LED semiconductor element and to the use of an LED semiconductor element.

BACKGROUND OF THE INVENTION

A high luminance is desirable for optical applications such as projection applications or display backlightings. In conventional LED semiconductor elements, the amount of radiation generated depends on the current intensity with which the LED semiconductor element is operated. However, the current density in the active layer should not exceed a maximum current density dependent on the semiconductor material used, since otherwise there is the risk of excessive ageing effects disadvantageously shortening the lifetime of the LED semiconductor element.

SUMMARY OF THE INVENTION

It is an object of the present invention to specify an LED semiconductor element having an increased luminance.

This and other objects are attained in accordance with one aspect of the present invention directed to an LED semiconductor element comprising at least one first radiation-generating active layer and at least one second radiation-generating active layer which is stacked above the first active layer in a vertical direction and is connected in series with the first active layer, wherein the first active layer and the second active layer are electrically conductively connected by means of a contact zone.

In the present case, the contact zone should be understood to be a region of comparatively good electrical conductivity, wherein the contact zone is preferably embodied in a manner free of tunnel contacts and therefore does not constitute a tunnel junction. Moreover, in the LED semiconductor element according to an embodiment of the invention, no tunnel junction is required for a charge carrier transfer between the first and the second active layer. This has the advantage that the LED semiconductor element can also be produced from materials with which a tunnel junction is relatively difficult to realize epitaxially. Although the active layers could be connected in parallel, such that a tunnel junction would be superfluous, a parallel connection would have the disadvantage that with different series resistances, the same current could not be injected into the two active layers, or could be injected only with considerable additional outlay. It is advantageously possible according to an embodiment of the invention to provide for a sufficient charge carrier transfer between the first and the second active layer by means of the contact zone and furthermore to inject the same current into the two active layers by means of the series connection.

In the present series connection, the pn junctions of the active layers are preferably arranged in the same sense, such that they form a pn-pn or np-np structure. It goes without saying that in the case of more than two active layers, a pn . . . pn or np . . . np structure is preferred.

Apart from a simple pn junction, the active layers can have a double heterostructure, a single quantum well or a multiple quantum well (MQW) structure. Examples of MQW structures are described in the documents WO 01/39282, WO 98/31055, U.S. Pat. No. 5,831,277, EP 1 017 113 and U.S. Pat. No. 5,684,309, the disclosure content of all of which concerning the MQW structures is hereby incorporated by reference.

In particular, two arrangements of the contact zone are preferred in the context of embodiments of the invention. In accordance with a first arrangement, the contact zone is arranged at a side flank of the semiconductor element. In accordance with a second arrangement, the contact zone is integrated into the LED semiconductor element between the first active layer and the second active layer.

Since the first active layer and the second active layer are connected in series, in the case of the active layers being arranged in the same sense, the contact zone expediently connects a semiconductor layer of a first conductivity type to a semiconductor layer of a second conductivity type. Preferably, the semiconductor layer of the first conductivity type is disposed downstream of the first active layer in a vertical direction, while the semiconductor layer of the second conductivity type is arranged in a vertical direction between the semiconductor layer of the first conductivity type and the second active layer. By way of example, the semiconductor layer of the first conductivity type can be a p-doped semiconductor layer and the semiconductor layer of the second conductivity type can be an n-doped semiconductor layer. As an alternative, the semiconductor layer of the first conductivity type can be an n-doped semiconductor layer and the semiconductor layer of the second conductivity type can be a p-doped semiconductor layer. This depends on the arrangement of the pn junctions of the active layers.

In order to improve the charge carrier transfer in a semiconductor element whose contact zone is arranged at the side flank, the semiconductor layer of the first conductivity type and the semiconductor layer of the second conductivity type can form a tunnel junction that supports the charge carrier transfer in addition to the contact zone. In particular, the semiconductor layer of the first conductivity type and the semiconductor layer of the second conductivity type can be highly doped for this purpose.

In accordance with one preferred embodiment, the semiconductor layer of the first conductivity type comprises a first free region not covered by semiconductor material. With further preference, the semiconductor layer of the second conductivity type comprises a second free region not covered by semiconductor material. In particular, the semiconductor layer of the second conductivity type can project with respect to the rest of the semiconductor element, while the semiconductor layer of the first conductivity type projects with respect to the layer of the second conductivity type. Consequently, the form of the semiconductor element between the first active layer and the second active layer in cross section can correspond to a stepped form at least at a side flank. It should be pointed out that the LED semiconductor element has a layer sequence of layers, of which at least a portion contains a semiconductor material. In the present case, the free region not covered by semiconductor material should be understood to be a region not covered by a semiconductor material used for the layers of the layer sequence.

In accordance with a particularly preferred variant, the contact zone extends from the first free region to the second free region. In particular, the contact zone can be a contact layer. By way of example, the contact layer can at least partly cover the first free region and the second free region.

Materials used for the contact zone and dimensions of the contact zone are preferably chosen depending on the lateral conductivity of the layers which the contact zone electrically conductively connects. By way of example, a p-doped GaN layer has a relatively low lateral conductivity, for which reason the contact zone in this case should be embodied in comparatively large-area fashion and should contain a material having high electrical conductivity.

In accordance with one preferred embodiment of the LED semiconductor element, the contact zone contains a metallic material. Such a contact zone is distinguished by a comparatively good electrical conductivity. This advantageously facilitates the charge carrier transfer between the first active layer and the second active layer.

In an alternative or more extensive configuration of the LED semiconductor element, the contact zone can be formed from a TCO (transparent conductive oxide) such as indium oxide, tin oxide, indium tin oxide (ITO) or zinc oxide.

A contact zone containing a TCO is advantageously radiation-transmissive, such that the radiation generated in a region below the contact zone can be coupled out from the semiconductor element through the contact zone.

In accordance with one advantageous configuration, the first and the second active layer are monolithically integrated in the semiconductor element. In this case, the first and the second active layer can be produced in a common production step.

Furthermore, the semiconductor element in an embodiment of the invention can a thin-film semiconductor element. If the semiconductor element is composed of prefabricated layer stacks, then the individual layer stacks can be thin-film semiconductor bodies. A thin-film semiconductor element is distinguished in particular by at least one of the following characteristic features:

- a reflective layer is applied or formed at a first main area—facing toward a carrier element—of a radiation-generating epitaxial layer sequence, said reflective layer reflecting at least part of the electromagnetic radiation generated in the epitaxial layer sequence back into the latter;
- the epitaxial layer sequence has a thickness in the range of 20 µm or less, in particular in the range of between 2 µm and 10 µm; and
- the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior.

The basic principle of a thin-film light emitting diode chip is described for example in I. Schnitzer et al., Appl. Phys. Lett. 63 (16), Oct. 18, 1993, 2174-2176, the disclosure content of which in this respect is hereby incorporated by reference.

A thin-film semiconductor element is, to a good approximation, a Lambertian surface emitter and is therefore particularly well suited to projection applications.

As already mentioned, in the case of the second arrangement the contact zone is integrated into the LED semiconductor element between the first active layer and the second active layer.

In accordance with one preferred configuration, the semiconductor element comprises a first layer stack including the first active layer, and a second layer stack including the second active layer. Particularly preferably, the contact zone is embedded between the first layer stack and the second layer stack in the case of this configuration.

In particular, the first layer stack comprises a semiconductor layer of a first conductivity type in addition to the first active layer and the second layer stack comprises a semiconductor layer of a second conductivity type in addition to the second active layer. Preferably, the first and the second layer stack are produced from two individual wafers. In order to produce the semiconductor element according to an embodiment of the invention, the wafers can be bonded onto one another in such a way that the semiconductor layer of the first conductivity type and the semiconductor layer of the second conductivity type face one another.

In accordance with a configuration to which further preference is given, the contact zone is arranged between the semiconductor layer of the first conductivity type and the semiconductor layer of the second conductivity type. Consequently, the contact zone is arranged in the main beam path of the semiconductor element, while in the first arrangement the contact zone is arranged in particular outside the main beam path.

In accordance with one preferred embodiment, the contact zone is a contact layer.

In accordance with an embodiment to which further preference is given, the contact zone has at least one first region and at least one second region. Particularly preferably, the second region is electrically conductive. The first region can be electrically conductive or insulating. By way of example, the contact zone can comprise a second region in the form of a contact pad or elongated contact web, wherein a material surrounding the second region forms the first region. The second region is advantageously arranged in such a way that it produces an electrical connection between the first and the second layer stack. In particular, the second region can contain a metallic material. The second region is preferably applied on a surface of the first or second layer stack which faces the opposite layer stack. As an alternative, each layer stack can have at least one second region arranged in such a way that in each case two second regions come to lie on one another when the two layer stacks are stacked one on another.

The contact zone expediently contains a material that is transmissive to the radiation generated by the first and/or second active layer. Consequently, there is no need to fear significant radiation losses through the contact zone arranged in the main beam path.

The contact zone can contain a TCO. Furthermore, the contact zone can contain an adhesion agent.

Furthermore, a first connecting layer can be applied on the semiconductor layer of the first conductivity type and a second connecting layer can be applied on the semiconductor layer of the second conductivity type. The connecting layers can be provided in particular for further improving the charge carrier transfer between the layer stacks. Preferably, the connecting layers contain a radiation-transmissive and electrically conductive material such as TCO. Particularly preferably, the contact zone is arranged between the first connecting layer and the second connecting layer.

Furthermore, a mechanical connection is advantageously produced by means of the contact zone between the first and second layer stacks.

Preferably, the first and the second active layer generate radiation having the same wavelength. The amount of radiation is thus advantageously increased by comparison with conventional LED semiconductor elements.

With further preference, the main emission from the LED semiconductor element is effected in a vertical direction. In particular, the main emission is effected within a comparatively constricted solid angle, such that the luminance is advantageously increased. The luminance is the optical power per emission area of the semiconductor element and solid angle element.

Particularly preferably, the radiation generated by the first active layer radiates through the second active layer. This is advantageous particularly in combination with a reflection layer that can be provided for the reflection of the radiation generated by the active layers in a vertical direction. For in contrast to active layers which generate radiation of different wavelengths, in this case the absorption of reflected radiation by the respective other active layer has no disadvantageous effect on the total radiation emitted.

In accordance with one variant, the semiconductor element, preferably one of the two active layers or both active layers, contains $Al_nGa_mIn_{1-n-m}P$, where $0 \leq n \leq 1$, $0 \leq m \leq 1$ and $n+m \leq 1$.

In accordance with a further variant, the semiconductor element, preferably one of the two active layers or both active layers, contains $Al_nGa_mIn_{1-n-m}As$, where $0 \leq n \leq 1$, $0 \leq m \leq 1$ and $n+m \leq 1$.

In accordance with a further variant, the semiconductor element, preferably one of the two active layers or both active layers, contains $Al_nGa_mIn_{1-n-m}N$, where $0 \leq n \leq 1$, $0 \leq m \leq 1$ and $n+m \leq 1$.

An LED semiconductor element according to an embodiment of the invention can advantageously be used for a radiation-emitting component since high luminances in conjunction with a comparatively small component size can be obtained by means of the LED semiconductor element.

Furthermore, an LED semiconductor element according to an embodiment of the invention or the radiation-emitting component comprising the LED semiconductor element according to an embodiment of the invention can be used in particular for general lighting, for backlighting, for example of displays, or for projection applications.

BRIEF DESCRIPTION OF THE DRAWINGS

Further features, advantages and developments of the invention will become apparent from the exemplary embodiments explained below in conjunction with FIGS. 1 to 4.

In the figures:

FIG. 1 shows a schematic cross-sectional view of a first exemplary embodiment of an LED semiconductor element according to the invention, FIG. 2 shows a schematic cross-sectional view of a second exemplary embodiment of an LED semiconductor element according to the invention, FIG. 3 shows a schematic cross-sectional view of a third exemplary embodiment of an LED semiconductor element according to the invention, FIG. 4 shows a schematic cross-sectional view of a fourth exemplary embodiment of an LED semiconductor element according to the invention.

DETAILED DESCRIPTION OF THE DRAWINGS

The LED semiconductor element 1 in accordance with a first exemplary embodiment as illustrated in FIG. 1 comprises a first radiation-generating active layer 2 and a second radiation-generating active layer 3, wherein the active layers are arranged one above another in a vertical direction, that is to say parallel to an emission direction and perpendicular to a main extension direction of the active layers. A first semiconductor layer 5 of a first conductivity type, for example a p-conducting semiconductor layer, and a second semiconductor layer 6 of a second conductivity type, for example an n-conducting semiconductor layer, are arranged between the active layers 2, 3.

The arrangement of the two active layers 2, 3 in the LED semiconductor element 1 advantageously increases the amount of radiation generated overall. Since the dimensions of the LED semiconductor element 1 change only insignificantly by comparison with an LED semiconductor element having only a single active layer and, in particular, the cross section of the LED semiconductor element is independent of the number of active layers, more extensively the luminance is also advantageously increased.

The semiconductor element 1 comprises a contact zone 4, which electrically conductively connects the semiconductor layer 5 to the semiconductor layer 6. Preferably, the semiconductor element 1 is processed in such a way that on at least one side flank part of the semiconductor layer 5 and part of the semiconductor layer 6 are uncovered, whereby a first free region 9 not covered by semiconductor material and a second free region 10 not covered by semiconductor material are formed. The contact zone 4 extends from the first free region 9 to the second free region 10 and at least partly covers them. The contact zone 4 can contain a metal, a metal compound or a radiation-transmissive oxide (TCO) such as ITO.

Furthermore, in order to improve the electrical connection, the two semiconductor layers 5, 6 can be embodied in highly doped fashion, such that an efficient tunnel junction with a low electrical contact resistance arises during operation.

The LED semiconductor element 1 comprises a rear side contact 7 disposed upstream of the active layers 2 and 3 in the vertical direction. Furthermore, the LED semiconductor element 1 comprises a front side contact 8 disposed downstream of the active layers 2 and 3 in a vertical direction. Consequently, a vertically conductive component is formed which is distinguished by a comparatively homogeneous current distribution within the LED semiconductor element 1.

More extensively, the semiconductor element 1 can be arranged on a carrier element (not illustrated) on the side of the rear side contact 7. In this case, the carrier element preferably contains an electrically conductive material. By way of example, the semiconductor element 1 can be a thin-film semiconductor element. In this case, the LED semiconductor element 1 is grown in particular on a growth substrate different than the carrier element and is subsequently mounted onto the carrier element, which can be done for example by means of soldering, bonding or adhesive bonding, the growth substrate preferably being stripped away from the LED semiconductor element. The rear side contact 7 can simultaneously serve as a mirror, such that radiation components impinging on the rear side contact 7 are reflected in a vertical direction, that is to say in this case in the direction of a radiation coupling-out side of the LED semiconductor element 1.

In the exemplary embodiment illustrated in FIG. 1, the active layers 2 and 3 are preferably monolithically integrated in the semiconductor element 1. By contrast, in the exemplary embodiment illustrated in FIG. 2, an individual first layer stack I comprising the active layer 2 and an individual second layer stack II comprising the active layer 3 are connected to one another in order to obtain the LED semiconductor element 1. The production step of connecting the two layer stacks I and II is symbolized by the arrows.

A contact layer that forms the contact zone 4 after the connection of the two layer stacks I and II is arranged on the layer stack I. As an alternative, the contact layer can be arranged on the layer stack II. The contact zone 4 is subsequently integrated into the LED semiconductor element 1 between the first active layer 2 and the second active layer 3.

The contact layer contains an electrically conductive material. Furthermore, the contact layer is transmissive to the radiation of the active layer 2 and/or of the active layer 3. The contact layer preferably contains an adhesion agent, such that the two layer stacks I and II are mechanically connected by means of the contact layer.

A rear side contact 7 can be applied to the layer stack I, while a front side contact 8 can be formed on the layer stack II. The contacts can be applied before or after the connection of the two layer stacks I and II.

In the exemplary embodiment of an LED semiconductor element 1 which is illustrated in FIG. 3, two layer stacks I and II are likewise arranged one on top of the other, wherein the contact zone 4 is integrated into the LED semiconductor element 1 between the layer stacks I and II. The contact zone 4 comprises a first region 4a and a plurality of second regions 4b. The second regions 4b are embedded into the first region 4a. Preferably, the second regions 4b are electrically conductive. The region 4a can be electrically conductive or insulating. As illustrated, the second regions 4b can be embodied in the form of contact pads, wherein one second region 4b is arranged on the layer stack I and another second region 4b is arranged on the layer stack II The two layer stacks I and II are connected to one another in such a way that the two regions 4b lie one on another. The layer stacks I and IT are electrically conductively connected to one another by means of the second regions 4b. Furthermore, the active layers 2 and 3 and the contact zone 4 are arranged with respect to one another in such a way that the active layers 2 and 3 are connected in series.

The two layer stacks I and II can be bonded onto one another by means of the second regions 4b. In addition, the first region 4a can contain an adhesion agent that mechanically connects the two layer stacks I and II. Preferably, the first region 4a is transmissive to the radiation generated by the active layer 2 and/or the active layer 3.

The LED semiconductor element 1 illustrated in FIG. 4 comprises a first layer stack I and a second layer stack II disposed downstream of the first layer stack I in a vertical direction, wherein the contact zone 4 is arranged between the layer stack I and the layer stack II. The contact zone 4 comprises a first region 4a and a second region 4b. The first region 4a and the second region 4b are arranged between a first connecting layer 4c and a second connecting layer 4d. The first connecting layer 4c and the second connecting layer 4d preferably serve to improve the charge carrier transfer between the layer stacks I and II. By way of example, the connecting layers 4c and 4d can contain a radiation-transmissive electrically conductive oxide (TCO) such as ITO. Particularly preferably, the connecting layers 4c and 4d are applied to the respective layer stack before the connection of the two layer stacks I and II. One of the two layer stacks I and II is furthermore provided with the second region 4b, embodied in particular as a contact pad or contact web. The second region 4b contains a material, in particular a metal, having a low electrical resistance, such that a comparatively good current flow across the contact zone 4 can take place. The first region 4a preferably contains an adhesion agent, such that the layer stacks I and II are mechanically connected in particular by means of the first region 4a.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An LED semiconductor element comprising:
   at least one first radiation-generating active layer,
   at least one second radiation-generating active layer which is stacked above the first active layer in a vertical direction and is connected in series with the first active layer,
   a semiconductor layer of a first conductivity type disposed downstream of the first active layer in a vertical direction, and
   a semiconductor layer of a second conductivity type arranged between the semiconductor layer of the first conductivity type and the second active layer,
   wherein the first active layer and the second active layer are electrically conductively connected by means of a contact zone; and
   wherein the semiconductor layer of the first conductivity type comprises a first free region not covered by semiconductor material.

2. The LED semiconductor element as claimed in claim 1, wherein the contact zone is arranged at a side flank of the LED semiconductor element.

3. The LED semiconductor element as claimed in claim 1, wherein the semiconductor layer of the first conductivity type and the semiconductor layer of the second conductivity type form a tunnel junction.

4. The LED semiconductor element as claimed in claim 1, wherein the semiconductor layer of the second conductivity type comprises a second free region not covered by semiconductor material.

5. The LED semiconductor element as claimed in claim 4, wherein the contact zone extends from the first free region to the second free region.

6. The LED semiconductor element as claimed in claim 1, wherein the contact zone contains a transparent conductive oxide (TCO).

7. The LED semiconductor element as claimed in claim 1, wherein the contact zone is integrated into the LED semiconductor element between the first active layer and the second active layer.

8. The LED semiconductor element as claimed in claim 7 wherein the contact zone has at least one first region and at least one second region.

9. The LED semiconductor element as claimed in claim 8, wherein the second region is electrically conductive.

10. The LED semiconductor element as claimed in claim 7, wherein the contact zone contains a material that is transmissive to the radiation generated by the first and/or second active layer.

11. The LED semiconductor element as claimed in claim 10, wherein the contact zone contains a transparent conductive oxide (TCO).

12. The LED semiconductor element as claimed in claim 7, wherein the contact zone contains an adhesion agent.

* * * * *

UNITED STATES PATENT AND TRADEMARK OFFICE
CERTIFICATE OF CORRECTION

PATENT NO.          : 8,003,974 B2                                          Page 1 of 1
APPLICATION NO.     : 12/441758
DATED               : August 23, 2011
INVENTOR(S)         : Peter Heidborn It is certified that error appears in the above-identified patent and that said Letters Patent is hereby corrected as shown below:

Title Page 2, Item (56) FOREIGN PATENT DOCUMENTS should read:

-- ~~DE   10 2004 026 1         12/2005~~

DE   10 2004 026 125      12/2005

~~DE   10 2006 039 3         7/2007~~

DE   10 2006 039 369      7/2007 --

Signed and Sealed this
Twenty-fifth Day of June, 2013

Teresa Stanek Rea
*Acting Director of the United States Patent and Trademark Office*